United States Patent [19]

Wakatsuki et al.

[11] 4,317,200

[45] Feb. 23, 1982

[54] METHOD AND DEVICE FOR TESTING A SEQUENTIAL CIRCUIT DIVIDED INTO A PLURALITY OF PARTITIONS

[75] Inventors: Nobuo Wakatsuki; Osamu Itoh, both of Tokyo, Japan

[73] Assignee: VLSI Technology Research Association, Kawasaki, Japan

[21] Appl. No.: 86,613

[22] Filed: Oct. 19, 1979

[30] Foreign Application Priority Data

Oct. 20, 1978 [JP] Japan .............................. 53-128538
Oct. 24, 1978 [JP] Japan .............................. 53-129982

[51] Int. Cl.$^3$ ............................................ G06F 11/26
[52] U.S. Cl. ........................................ 371/25; 371/21
[58] Field of Search ......................... 371/15, 21, 25, 27

[56] References Cited

U.S. PATENT DOCUMENTS

| | | | |
|---|---|---|---|
| 3,573,751 | 4/1971 | DeLisle | 371/25 X |
| 3,821,645 | 6/1974 | Vinsani | 371/25 X |
| 3,961,254 | 6/1976 | Cavaliere et al. | 371/21 X |
| 3,988,670 | 10/1976 | Gariazzo | 371/25 X |

*Primary Examiner*—Jerry Smith
*Attorney, Agent, or Firm*—Sughrue, Mion, Zinn, Macpeak and Seas

[57] ABSTRACT

For test, a sequential circuit operable in a normal and a shift mode is logically divided into a plurality of partitions, each comprising a first and a second sequence of registers. A testing device specifies the first sequence in each partition, one partition after another, and supplies the registers of the specified first sequence, in the shift mode, with a test pattern prescribed for the specified partition. A pattern resulting from the test pattern is supplied in the normal mode to the registers of the second sequence in the specified partition and shifted out thereof subsequently in the shift mode to be compared with a correct or reference pattern predetermined for the test pattern for detection of a fault. For location of the fault in the specified partition, the test and the shifted-out patterns are combined into a combined pattern, which is supplied to the registers of the first and the second sequences in the normal mode following the shift mode in which the fault is detected.

4 Claims, 5 Drawing Figures

METHOD AND DEVICE FOR TESTING A SEQUENTIAL CIRCUIT DIVIDED INTO A PLURALITY OF PARTITIONS

BACKGROUND OF THE INVENTION

This invention relates to a method and a device for testing a sequential circuit. It should be noted here that the term "sequential circuit" means throughout the instant specification a combination of a plurality of registers, namely, memories with a combinational circuit.

It is a recent trend to fabricate a sequential circuit by the large-scale integration technique. A test is indispensable for determining the reliability of a sequential circuit integrated on a large scale to form a multiplicity of registers or memories. During the test of the sequential circuit, the respective registers are connected so that they are operable not only as normal registers in a normal mode but also as a single shift register of cascade connection in a shift mode. The test is automatically executed by the use of a testing device. A conventional testing device puts all the registers in the sequential circuit into operation in the normal and shift modes and derives an external status data set and an internal status data set from the sequential circuit by the use of a preselected test pattern of a multiplicity of test data. The external and internal status data sets are compared with correct patterns prepared in the testing device, respectively, to detect whether or not a fault or defect is present in the sequential circuit. With the conventional testing device, it is difficult to locate a fault in the sequential circuit, as will later be described with reference to one of several figures of the accompanying drawing. All of the test data for the test pattern should be rearranged even when the sequential circuit is partially varied in design. By the way, preparation of the test pattern becomes more difficult with an increase in the number of the registers in the sequential circuit. Therefore, the conventional testing device and method are not useful for testing a sequential circuit of large-scale integration.

SUMMARY OF THE INVENTION

It is an object of this invention to provide a method of testing a sequential circuit, which is suitable even for a sequential circuit of very large scale integration.

It is another object of this invention to provide the method of the type described, which is capable of readily coping with a modification of a sequential circuit.

It is still another object of this invention to provide a testing device that is capable of readily testing a sequential circuit comprising a considerable number of registers or memories.

It is a further object of this invention to provide a testing device of the type described, which is capable of locating a fault in the sequential circuit.

According to this invention, there is provided a method of testing a sequential circuit to detect a fault therein. The sequential circuit comprises a multiplicity of registers for storing information units, such as bits or signals, respectively. The registers are operable as normal registers in a normal mode and as a shift register with the registers connected in cascade in a shift mode. The sequential circuit is divisible into a succession of partitions each of which comprises a first and a second sequence of the registers of a first and a second predetermined number of registers, respectively. The method comprises the steps of preparing test patterns predetermined for the respective partitions and correct or reference patterns for the respective test patterns, each test pattern having a data length equal to the first predetermined number of registers in its respective partition, each correct or reference pattern having a data length of the second predetermined number of registers in its respective partition; allotting serial addresses to the respective registers connected in cascade; deriving a first and a second address from the serial addresses, the first and the second addresses being the addresses allotted to the leading ones of the registers of the first and the second sequences in each partition, one partition after another in the succession of partitions; selecting one of the test patterns that is predetermined for said each partition; imparting, in the shift mode, the one test pattern to the respective registers of the first sequence of said each partition as the information bits or signals therefor with reference to the first address; making, in the normal mode, the registers of the second sequence in said each partition hold a set of status data resulting from the one test pattern as the information bits stored in the registers of the first sequence in said each partition, the status data set having a data length of the second predetermined number of the registers in said each partition; deriving the status data set in the shift mode from the registers of the second sequence in said each partition; selecting one of the reference patterns prepared for the one test pattern; and comparing the status data set with the selected correct pattern to detect the fault when the status data set is non-coincident with the correct pattern.

According to this invention, there is also provided a device for testing a sequential circuit to detect a fault therein. The sequential circuit comprises a multiplicity of registers for storing information bits or signals, respectively. The registers are operable as normal registers in a normal mode and as a shift register with the registers connected in cascade in a shift mode. The sequential circuit is divisible into a succession of partitions which are specifiable by specifying numbers, respectively, and each of which comprises a first and a second sequence of the registers of a first and a second predetermined number of registers, respectively. The device comprises memory means for memorizing a program for the fault detection and a test pattern series separable into a series of partial test patterns corresponding to the respective partitions and each having a data length of the first predetermined number of registers in its respective partition, there being correct patterns predetermined for the respective partial test patterns and each having a data length of the second predetermined number of registers in its respective partition; reading means for reading the program to successively derive the specifying numbers to specify each of the partitions, one after another in the succession of partitions, and also for reading one of the partial test patterns as a first data series, the one partial test pattern corresponding to said each partition; holding means responsive to the first data series and a second data series for holding the first and the second data series as a shift-in data series, at first irrespective of presence and absence of a fault in said each partition, and subsequently only when a fault is detected in said each partition, respectively; driving means for driving the sequential circuit first in the shift mode then, in the normal mode, and again the shift mode; input-output means operatively coupled to the reading means, the holding means, and the driving means for supplying, while the sequential circuit is put in the shift mode at first, the shift-in data series to the registers of the first sequence in said each partition as the information signals therefor, with the shift-in data series kept in the holding means, and to the registers of both the first and second sequences in said each partition as the information bits therefor when the holding means holds the first and the second data series, respectively, and for deriving, while the sequential circuit is driven in the normal mode, a third data series of a data length of the second predetermined number of registers for said each partition from the first data series stored in the registers of the first sequence in said each partition to supply the third data series to the registers of the second sequence in said each partition and to make, while the sequential circuit is subsequently driven in the shift mode, the last-mentioned registers produce the imparted third data series as a shift-out data series; comparing means for comparing the shift-out data series with the correct pattern predetermined for the partial test pattern corresponding to said each partition to produce a fault signal for said each partition when the shift-out data series is non-coincident with the last-mentioned correct pattern; combining means, operatively coupled to the comparing means and responsive to the first data series kept in the holding means and the shift-out data series, for combining the last-mentioned first data series and the shift-out data series into a fourth data series when said comparing means produces the fault signal; and moving means for moving the fourth data series from the combining means to the holding means as the second data series.

DESCRIPTION OF THE PREFERRED EMBODIMENTS

Figure 1:
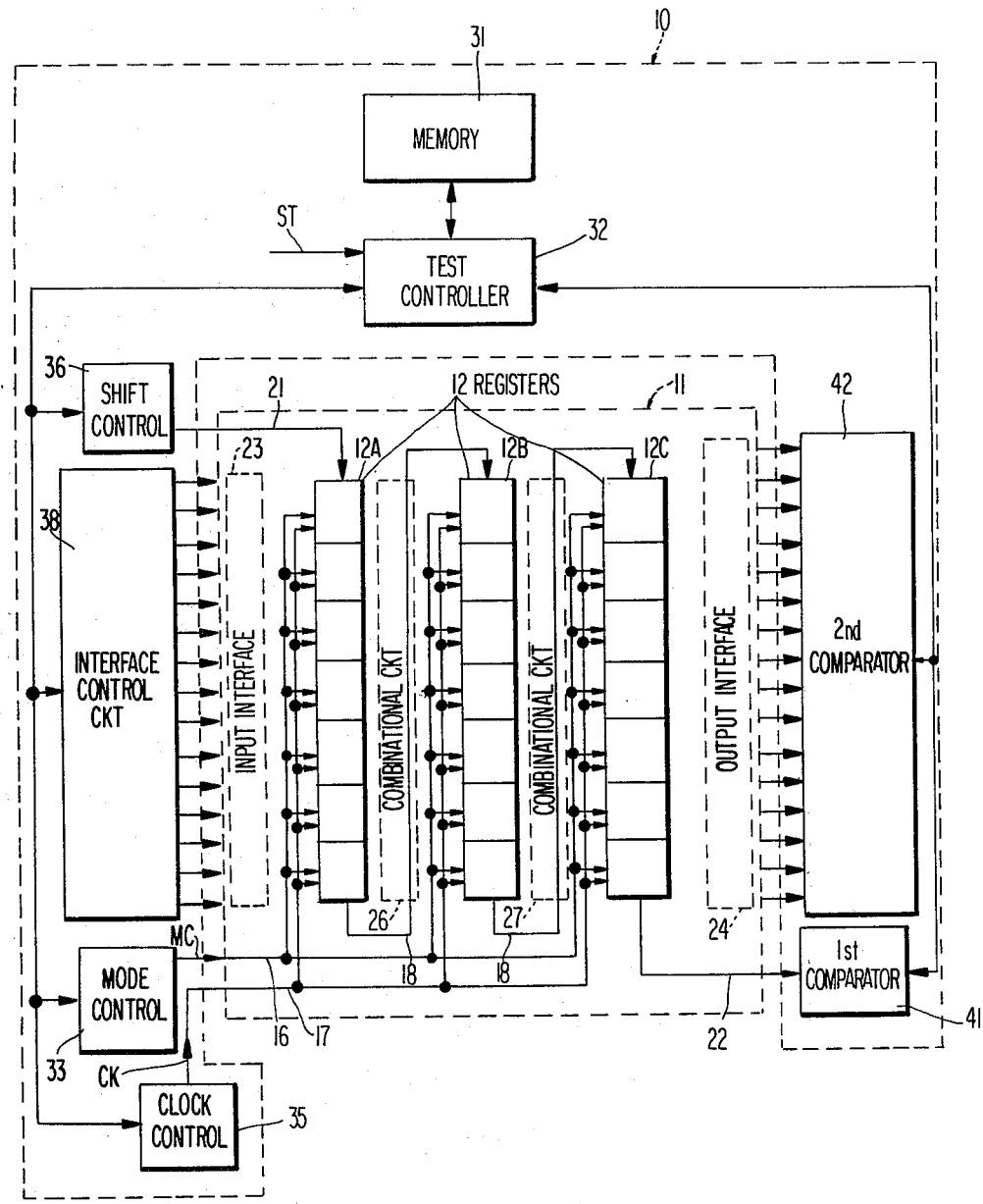
FIG. 1 is a block diagram for describing a conventional device and a conventional method for testing a sequential circuit.

Referring to FIG. 1, description will be made of a conventional device 10 for a sequential circuit 11 in order to facilitate an understanding of this invention. The sequential circuit 11 comprises a multiplicity of registers 12 which are operable as normal registers in a normal mode and as a single shift register in a shift mode and each of which is capable of storing an information unit, such as a bit or signal. As exemplified, the registers 12 are divided into three groups which will be referred to as first, second, and third groups 12A, 12B, and 12C, from left to right. For operation in the two modes, each of the registers 12 is connected to a first line 16 for transmitting a mode control pulse MC representative of the normal and shift modes and to a second line 17 for transmitting a controllable sequence of clock pulses CK. Merely for brevity of description, the mode control pulse MC is assumed to take logic "1" and "0" levels in the normal and shift modes, respectively. The register groups 12A to 12C are connected in cascade by lines 18. In addition, the leading one of the registers 12 connected in cascade is connected to an input line 21 for a shift-in data series, while the last is connected, to an output line 22 for a shift-out data series. Broken line blocks depicted in front of the group 12A and in the rear of the group 12C designate an input interface 23 for an external input data set and an output interface 24 for an external output data set, respectively. Both of the interfaces 23 and 24 are coupled to the registers 12 and enabled in the normal mode, although not explicitly shown. Broken line blocks drawn between the first and second groups 12A and 12B and between the second and third groups 12B and 12C allude to logic or combinational circuits 26 and 27 both of which are enabled in the normal mode.

The testing device 10 is connected to the sequential circuit 11 during the test through the input and the output lines 21 and 22, the first and the second lines 16 and 17, and the input and the output interfaces 23 and 24 and comprises a memory 31 for memorizing a program of a sequence of test instructions which defines the test, a first test pattern of a first test data set having a data length equal to the total number of the registers 12 in the sequential circuit 11, and a second test pattern of a second data set to be supplied to the input interface 23. Preparation is made of first and second reference or correct patterns to be derived from the first and second test data sets, respectively. The first and second correct patterns are also memorized in the memory 31.

A test controller 32 is coupled to a mode control circuit 33 and a clock control circuit 35 for supplying the respective registers 12 with the mode control pulse MC through the first line 16 and the clock pulses CK through the second line 17, respectively, to put the sequential circuit 11 into operation in the normal and shift modes. The test controller 32 is coupled also to a shift control circuit 36 for supplying the registers 12 with the first test pattern as the shift-in data series through the input line 21, and to an interface control circuit 38 for supplying the input interface 23 with the second test pattern as the external input data set. The external output data set thereupon appears on the output interface 24 in response to the second test pattern in the normal mode, while the shift-out data series appears on the output line 22 in the shift mode. Connected between the output line 22 and the test controller 32, a first comparator 41 compares the shift-out data series with the first reference pattern read out of the memory 31 to produce a first fault signal representative of a fault taking place in a circuit section connected to the registers 12. Coupled to the output interface 24 and the test controller 32, a second comparator 42 compares the external output data set with the second correct pattern read out of the memory 31 to produce a second fault signal representative of a fault occurring in any circuit section connected to the output interface 24.

The test is carried out as follows.

Step 1.

At first, the test controller 32 is supplied with a test start signal ST from a manually operable means (not shown), for example, a push button to start the test. The test controller 32, in response to the test start signal ST, reads the program from the memory 31 and energizes the mode control circuit 33 in accordance with the program. As a result, the mode control circuit 33 supplies the first line 16 with a mode control pulse MC of the logic "0" level to put the respective registers 12 in the shift mode.

Step 2.

Next, the test controller 32 puts the shift control circuit 36 and the clock control circuit 35 into operation in accordance with the program. At this time, the shift control circuit 36 is supplied with the first test pattern in series as the shift-in data series from the memory 31 through the test controller 32. Inasmuch as the respective registers 12 act as single shift registers in the mode, the shift-in data series is successively shifted in the respective registers 12 through the cascade connection 18 in synchronism with the clock pulses CK.

Step 3.

After the shift register is full of the first test pattern series, the mode control circuit 33 puts the respective registers 12 in the normal mode under control of the test controller 32. In this state, each of the test data is kept in the respective registers 12 and enables the output interface 24 and the logic circuits 26 and 27 related to the registers 12.

Step 4.

Under the circumstances, the interface control circuit 38 is energized by the test controller 32 and is supplied with the second test pattern, as the external input data set read out of the memory 31 through the test controller 32. Supplied with the first and second test patterns, the sequential circuit 11 is kept in an internal and an external logic state defined by the first and second test patterns. The external logic state appears as the external output data set from the output interface 24.

Step 5.

The external output data set is delivered from the output interface 24 to the second comparator 42 which is given the second reference pattern read out of the memory 31 in accordance with the test program. The second comparator 42 compares the external output data set with the correct pattern. Non-coincidence of the external output data set with the second correct pattern indicates a fault in a circuit section related to the output interface 24. A fault signal is supplied to the test controller 32 on occurrence of the non-coincidence. The test controller 32 begins to analyze the fault.

Step 6.

When a non-coincidence is not detected in the second comparator 42, the clock control circuit 35 is temporarily energized by the test controller 32 to produce a single one of the clock pulses CK. As a result, the internal logic state is substituted for the test data of the first test pattern series in the respective registers 12 and is kept as an internal status data set in the respective registers 12.

Step 7.

The test controller 32 energizes the mode control circuit 33 in accordance with the program, with the clock control circuit 35 stopped. The mode control circuit 33 supplies the first line 16 with the mode control pulse MC of the logic "1" level. As a result, the sequential circuit 11 is changed into the shift mode.

Step 8.

Subsequently, the shift control circuit 36 and the clock control circuit 35 are put into operation by the test controller 32 to derive the internal status data set as the shift-out data set through the shift register. The shift-out data set is successively supplied through the output line 22 to the first comparator 41. The first correct or reference pattern is supplied from the test controller 32 to the first comparator 41. The first comparator 41 compares the shift-out data set with the first correct pattern to produce the first fault signal when the former is non-coincident with the latter.

It is now understood that the length of the first test pattern necessarily increases as the registers 12 increase in number. Moreover, it is necessary not only to keep the shift-out data set but also to keep the internal status data set in order to locate the fault in the sequential circuit 11. However, the internal status data set is destroyed in the testing device 10 before the shift-out data set is derived from the testing device. Under these circumstances, the conventional test device and the conventional method have disadvantages as mentioned in the preamble of the instant specification.

Figure 2:
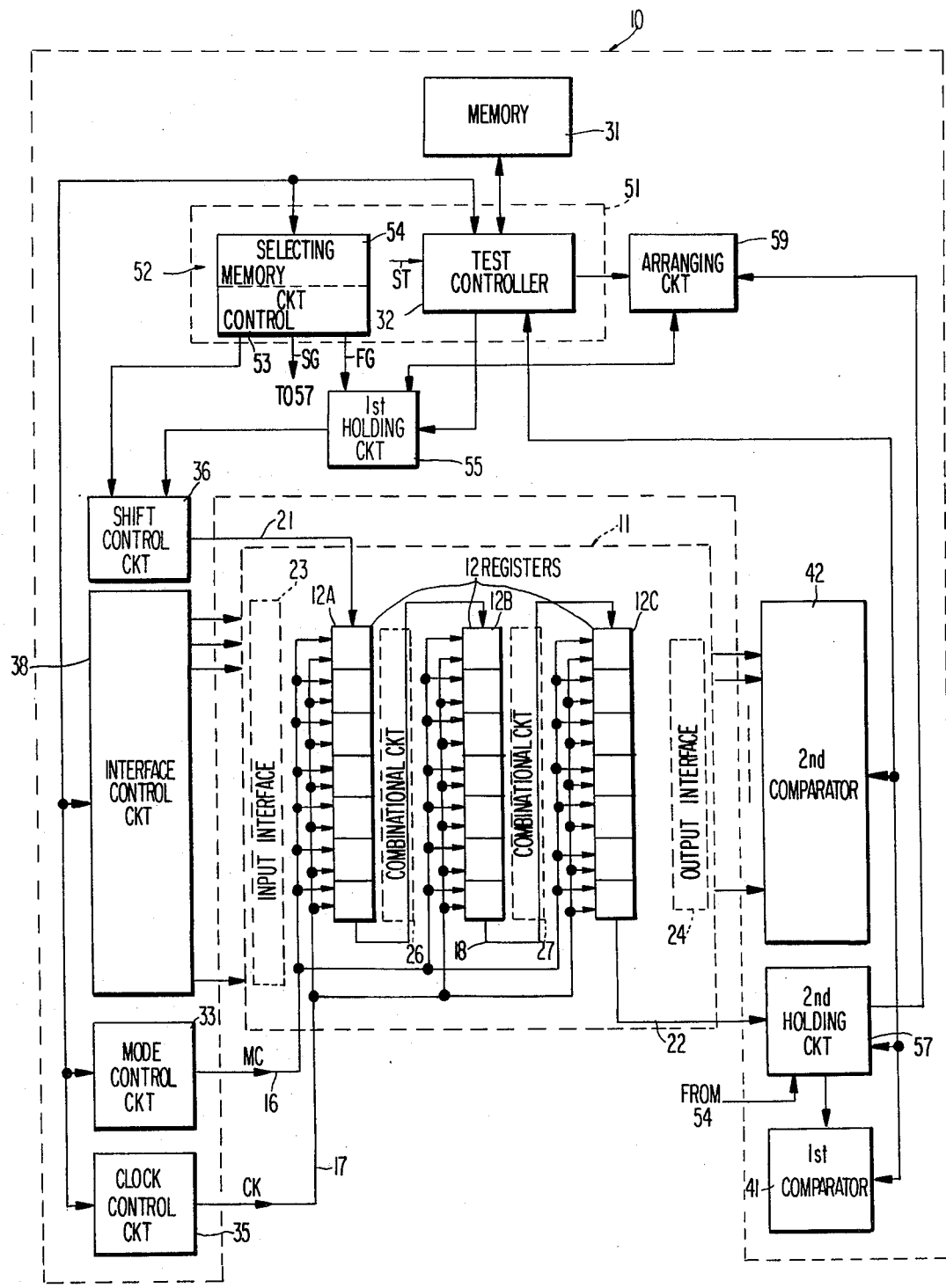
FIG. 2 shows a block diagram of a testing device according to an embodiment of this invention, with a sequential circuit connected thereto.

Referring to FIG. 2, a testing device 10 according to an embodiment of this invention comprises similar parts designated by like reference numerals and is operable with similar signals indicated by like reference letters. As in FIG. 1, the testing device 10 is connected to the sequential circuit 11 comprising the registers 12 which act as a single shift register in a shift mode.

Figure 3:
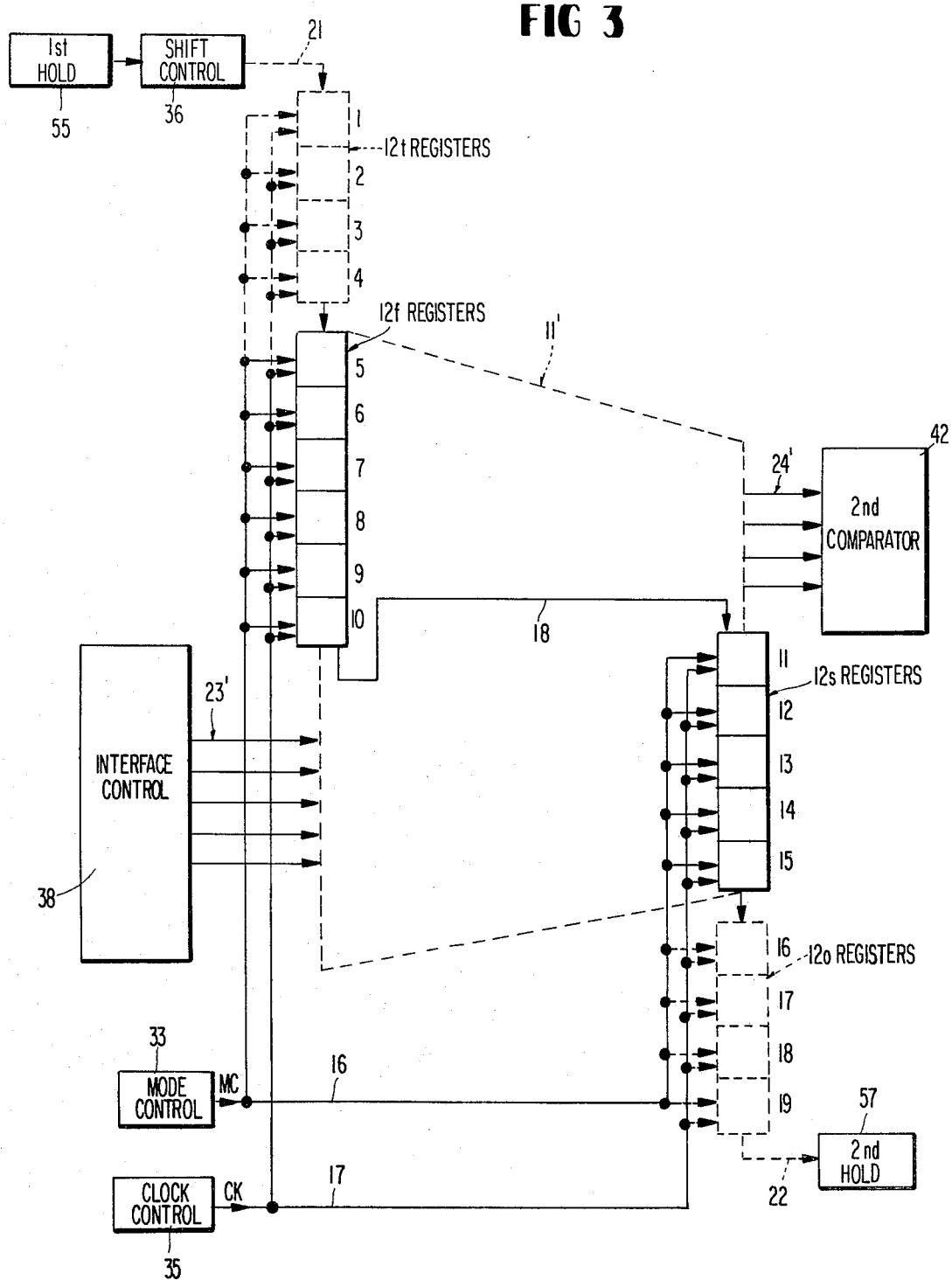
FIG. 3 shows a block diagram for describing a testing method according to an embodiment of this invention.

Referring to FIG. 3 together with FIG. 2, and sequential circuit 11 is logically divided into a succession of partitions one of which is depicted, as a partition to be specified, by 11' in FIG. 3 and each of which is logically isolated from the others. The partition 11' comprises first and second sequences 12f and 12s of six and five of the registers 12, respectively. The first and second sequences 12f and 12s of registers may be optionally selected from the first, the second, and the third groups 12A, 12B, and 12C shown in FIG. 2. For example, they may not be directly connected to each other in cascade. Merely for simplicity of description, the first and second sequences 12f and 12s are directly connected in cascade by one of the lines 18. The first sequence 12f is connected to the input line 21 through a third sequence 12t of four registers while the second sequence 12s is connected to the output line 22 through a fourth sequence 12o of four registers. The third and fourth sequences 12t and 12o are in other partitions preceding and following the partition 11', respectively. Serial addresses are allotted to the respective registers 12 connected in cascade from the third sequence 12t to the fourth sequence 12o serially through the first and second sequences 12f and 12s. As indicated in FIG. 3, addresses "1" through "4" are allotted to the respective registers of the third sequence 12t. Similarly, addresses "5" through "10," addresses "11" through "15," and addresses "16" through "19" are assigned to the registers of the first, the second, and fourth sequences 12f, 12s, and 12o, respectively. Under these circumstances, the first sequence 12f of the partition 11' is specifiable by a first number or six of the registers and by the address "5" allotted to the leading one of the first sequence 12f as a first address. Likewise, the second sequence 12s of the partition 11' is specified by a second number or five of the registers and the address "11" allotted to the leading one of the second sequence 12s as a second address. The third and fourth sequences 12t and 12o are also specifiable in the similar manner.

Further referring to FIG. 3, the partition 11' is connected with a partial input interface 23' which is a part of the input interface 23 shown in FIG. 2 and to a partial output interface 24' of a part of the output interface 24. These partial interfaces 23' and 24' are all of the interfaces to be connected to the partition 11'. Although not shown in this figure, the partition 11' comprises a logic or combinational circuit as exemplified by 26 and 27 in FIG. 2. Each logic circuit executes a desired calculation in the normal mode in accordance with a data set supplied through the first sequence 12f and the partial input interface 23' to deliver an external output data set and an internal status data set to the partial output interface 24' and to the second sequence 12s, respectively.

Referring to FIG. 3 again, there is provided a first test pattern series separable into a series of first partial test, patterns, together with a sequence of first correct or reference patterns for the respective partitions. The first partial test patterns and the correct patterns are represented by predetermined combinations of the logic "1" and "0" levels. Each of the first partial test patterns has a data length equal to the first number (e.g., six) of registers in its respective partition. Each of the first correct patterns is predetermined for the respective first partial test patterns and has a data length equal to the second number (e.g., five) of registers in each of the partitions. For example, the first partial test pattern of "001011" and the first correct pattern of "11010" are prepared in order to test the partition 11' illustrated in FIG. 3. The respective patterns are arranged for the registers of the leading addresses to the trailing ones in the respective sequences. In addition, preparation is made of a succession of second test patterns and a succession of second correct or reference patterns for the partial input interface 23' and the partial output interface 24', respectively. For example, the second test pattern of "11001" and the second correct reference pattern of "1011" are predetermined for the partial input interface 23' and the partial output interface 24' of the partition 11', respectively.

Turning back to FIG. 2, the memory 31 in the testing device 10 memorizes, as a fault detecting data set, the first test pattern series and the second test patterns, the first and second addresses, the first and second numbers of registers, and the first and second correct patterns, all for the respective partitions. A program of a succession of test instructions is also memorized in the memory 31 to define fault detection. In the testing device 10 illustrated in FIG. 2, the test controller 32 serves as a part of a control section 51 and may be a general purpose computer for reading the test instructions and the fault detecting data set to successively execute the instructions and to deliver the fault detecting data set and a control signal to various other elements. The test controller 32 is thus capable of reading, in order to specify one of the partitions, one of the first addresses and one of the first numbers out of the memory 31 and also of reading, for the specified partition, one of the second addresses and one of the second numbers. The first test pattern series is partially read out from the memory 31 in fixed data length which may not be equal to that of the first partial data series for each partition. The second test patterns and the first and second correct patterns are also read out of the memory 31 through the test controller 32 in the usual manner.

Further referring to FIG. 2, the control section 51 comprises a selecting circuit 52 to select one of the first partial test patterns as a first data series. The first selected partial test pattern corresponds to the specified partition and has a data length of the number of the registers in the first sequence of the specified partition. Specifically, the selecting circuit 52 comprises a control part 53 coupled to the test controller 32 and a memory part 54 memorizing, while the specified partition is tested by the testing device, the first address, the first number, the second address, and the second number for the specified partition under control of the control part 53. The control part 53 produces a first gating pulse FG with reference to the first address and the first number memorized in the memory part 54. The first gating pulse FG appears during a time that the test controller 32 is reading the first partial test pattern for the specified partition. That is, the selecting circuit 52 serves to select the specified one of the first partial test patterns from their series in cooperation with the test controller 32. Eventually, the control section 51 reads one of the first partial test patterns as a first data series. As will be elucidated later, the selecting section 52 according to this embodiment also serves to produce a second gating pulse SG for indicating a shift-out data series to be derived and to produce the first address and the first number memorized therein.

The first data series is kept in a first holding circuit 55 as a shift-in data series in response to the first gating signal FG and the first partial test pattern series, prior to the fault detection. The first holding circuit 55 is supplied with a second data series as will be described later, only when a fault is detected in the specified partition. As in FIG. 1, the mode control circuit 33 is provided in the testing device 10 to put the sequential circuit 11 in a normal and a shift mode. Specifically, the mode control circuit 33 according to this embodiment drives the sequential circuit 11 in the shift mode at first, in the normal mode secondly, and in the shift mode thirdly. The third shift mode is followed again by a normal mode as occasion demands.

Referring to FIG. 2 together with FIG. 3, the clock control circuit 35 cooperates with the shift control circuit 36 to act as an input-output circuit. As illustrated in FIG. 2, the shift control circuit 36 is coupled to the selecting circuit 52 and operatively coupled to the test controller 32 through the first holding circuit 55. The clock control circuit 35 is coupled to the shift controller 36 and the test controller 32. The clock and shift control circuits 35 and 36 are put into operation by the test controller 32 in synchronism with the mode control circuit 33. When the first holding circuit 55 holds the first data series and the sequential circuit 11 is put in the shift mode at first, the first data series is shifted as the shift-in data series to the registers of the first sequence 12f in the specified partition in synchronism with the clock pulses CK supplied from the clock control circuit 35. During this shift-in operation, the shift control circuit 36 acts to place the shift-in data series in the desired registers with reference to the first address and the first number supplied from the selecting circuit 52. It is mentioned here that, when the shift-in data series is the first data one, the first data series continues to be kept in the first holding circuit 55 after it was supplied from the first holding circuit 55 to the shift control circuit 36. Therefore, the first holding circuit 55 is cyclically driven in the shift mode. Next, the sequential circuit 11 is driven in the normal mode by the mode control circuit 33 and is supplied with a single one of the clock pulses CK. As a result, each of the registers 12 holds an internal status data determined by prior status of a circuit section of the sequential circuit 11 related to the respective registers 12. Especially, the registers of the second sequence 12s in the specified partition hold a third data series derived from the first data series which was stored in the registers of the first sequence in the specified partition. The third data series has a data length of the second number of registers in the specified partition. When the sequential circuit 11 is subsequently driven in the shift mode by the mode control circuit 33 and is supplied with the clock pulses CK, a second holding circuit 57 cooperates with the test controller 32 and the selecting circuit 52. This means that the second holding circuit 57 is operatively coupled to the control section 51, the mode control circuit 33, and the clock control circuit 35. Therefore, the second holding circuit 57 acts as a part of the input-output circuit. By the cooperating operation, the third data series is read out from the registers of the second sequence 12s to the second holding circuit 57 as the shift-out data series. Specifically, the second holding circuit 57 derives the shift-out data series in response to the second gating pulse SG supplied from the selecting circuit 52 with reference to the second address and the second number. Thus, the shift-out data series is derived from the registers of the second sequence 12s in the specified partition. Supplied with the second data series as the shift-in data series, the shift control circuit 36 reads out the shift-in data series to both of the first and the second sequences 12f and 12s of registers in the specified partition.

The shift-out data series is supplied to the first comparator 41, which is supplied also with the first correct or reference pattern predetermined for the first partial test pattern corresponding to the specified partition. The first comparator 41 compares the shift-out data series with the first specified correct pattern to produce a fault signal for the specified partition when the shift-out data series is non-coincident with the first specified correct pattern. In the meanwhile, the shift-out data series is kept in the second holding circuit 57. Supplied with the fault signal, the test controller 32 makes the shift-in data series kept in the first holding circuit 55 and the shift-out data series move from the first and the second holding circuits 55 and 57, respectively, to an arranging circuit 59, which may be a series of flip-flops. The arranging circuit 59 produces a combination of the shift-in data series and the shaft-out data series, together with a sum of the data lengths of the respective series. The combination and the sum are again moved as the second data series from the arranging circuit 59 to the first holding circuit 55. As a result, the second data series is substituted for the first data series in the first holding circuit 55. In addition, use is made of the interface control circuit 38 and the second comparator 42 to transmit the second test patterns to the sequential circuit 11 and to produce the second fault signal, respectively, as described with reference to FIG. 1. Therefore, the interface control circuit 38 and the second comparator 42 serve as a part of the input-output circuit.

Figure 4:
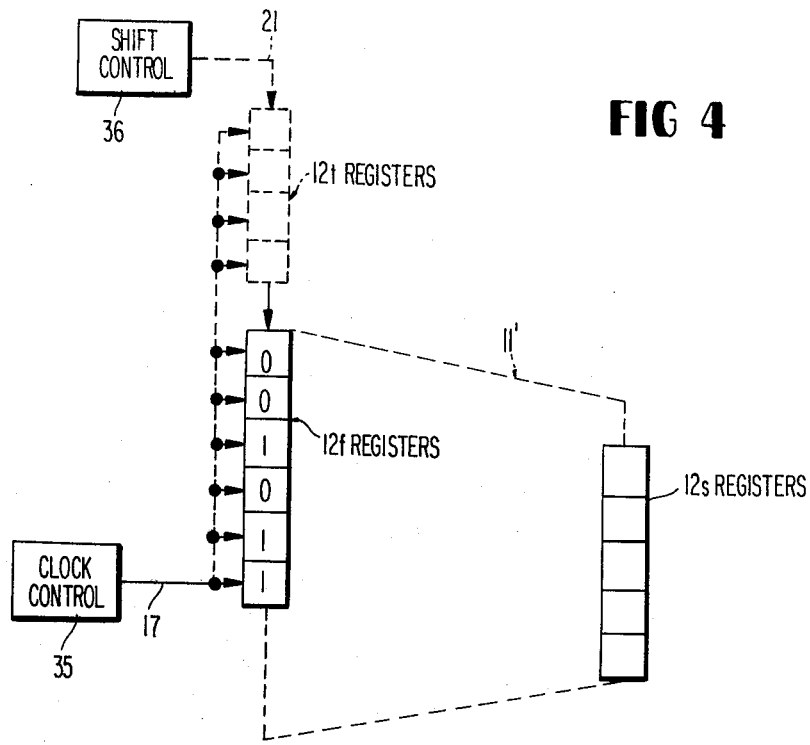
FIG. 4 is a block diagram for specifically describing a shift-in operation used in the method to be described with reference to FIG. 3.
Figure 5:
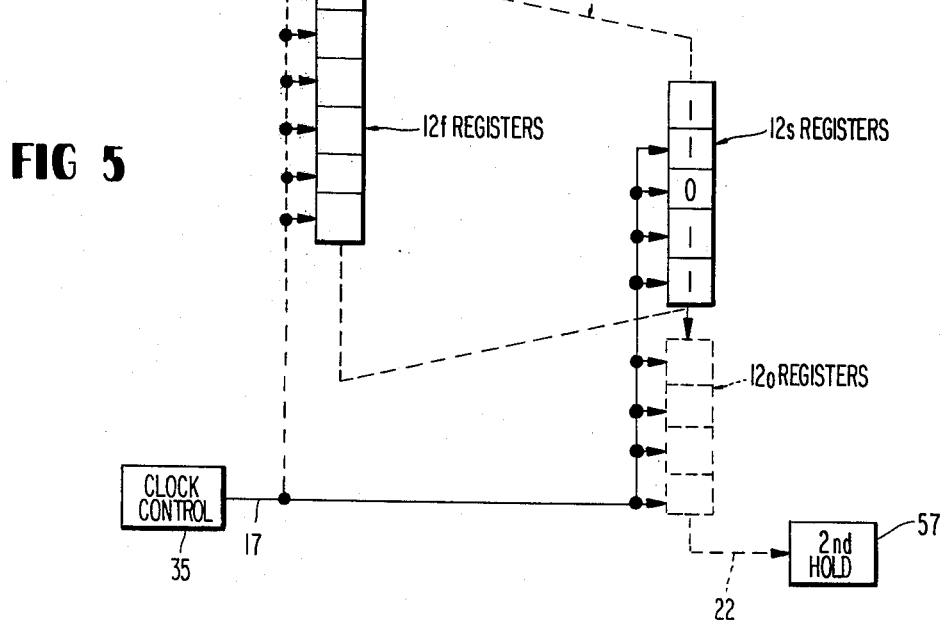
FIG. 5 is a block diagram for specifically describing a shift-out operation used in the above-mentioned method.

Referring to FIGS. 2 and 3 again and FIGS. 4 and 5 afresh, description will be made of a method of testing the sequential circuit 11 according to this invention. For brevity of description, the test of the partition 11' illustrated with reference to FIG. 3 is considered hereinafter. It is assumed that the memory 31 memorizes, for the partition 11', "5," "6," "11," and "5" as the first address, the first number, the second address, and the second number, respectively. Further, let the first partial test pattern, the first correct pattern, the second test pattern, and the second correct pattern by "001011," "11010," "11001," and "1011," respectively, as exemplified hereinabove.

Step 1.

Like in FIG. 1, the test controller 32 starts the test in response to a start signal ST supplied from a push button or the like and gives access to the memory 31 to read the program therefrom and to, thereafter, energize the mode control circuit 33 in accordance with the program. The mode control circuit 33 delivers the mode control signal MC of the logic "0" level to put the respective registers 12 in the shift mode.

Step 2.

On testing the partition 11', the test controller 32 reads the first address of "5," the first number of "6," the second address of "11," and the second number of "5" out of the memory 31 to load the memory part 54 therewith.

Step 3.

In this step, the first test pattern series is read out of the memory 31 in fixed data length predetermined in the memory 31 and is successively supplied to the first holding circuit 55. The read-out first test pattern includes another pattern or instruction in addition to the first partial test pattern of "001011" for the partition 11'. Therefore, the selecting circuit 52 cooperates with the test controller 32 to select only the desired pattern for the partition 11' with reference to the first address and the first number and to make the first holding circuit 55 keep the selected pattern. Thus, the first partial test pattern is held as the shift-in data series.

Step 4.

Under these circumstances, the test controller 32 energizes the shift control circuit 36, the clock control circuit 35, and the selecting circuit 52 in accordance with the program. The shift control circuit 36 shifts the shift-in data series of "001011" from the first holding circuit 55 to the registers 12 connected in cascade, with reference to the first address of "5" and the first number of "6" in synchronism with the clock pulses CK. When the shift-in data series is kept in the six registers of the first sequence 12f, the clock control circuit 35 stops the clock pulses CK under control of the shift control circuit 36. In FIGS. 3 and 4, eleven clock pulses CK may be supplied from the clock control circuit 35 to make the shift-in data series kept in the six registers of the first sequence 12f of the partition 11' through the four registers of the third sequence 12t.

Step 5.

Subsequently, the mode control circuit 33 drives the respective registers 12 in the normal mode under control of the test controller 32. In this state, the shift-in data series kept in the first sequence 12f serves to partially energize the logic circuit in the partition 11'.

Step 6.

Thereafter, the test controller 32 puts the interface control circuit 38 into operation to impart the second test pattern thereto. As a result, the pattern of "11001" appears at the partial input interface 23'. All of input conditions for the partition 11' are determined by way of Steps 5 and 6. Therefore, the logic circuit in the partition 11' is effectively operable in accordance with these input conditions to supply the partial output interface 24' with an external status data set representative of the results of operation. In this state, an internal status data set appears at input sides of the registers of the second sequence 12s but is not held therein during absence of the clock pulses CK.

Step 7.

The external status data set is delivered from the partial output interface 24' to the second comparator 42 under control of the test controller 32. The test controller 32 moves the second correct pattern of "1011" from the memory 31 to the second comparator 42. The second comparator 42 compares the derived external status data set with the second correct pattern to produce the second fault signal when the former is non-coincident with the latter. The non-coincidence is representative of the fact that a fault occurs in a circuit section of the partition 11' related to the partial output interface 24'. An analysis of the fault begins after production of the fault signal but it is not important in this invention. Therefore, description is directed, hereinunder, to the case where the second fault signal is not produced.

Step 8.

Unless the fault signal is supplied from the second comparator 42, the test controller 32 puts the clock control circuit 35 into operation. In this step, the clock control circuit 35 supplies the respective registers with a single one of the clock pulses CK to make the internal status data set kept as the third data series in the registers of the second sequence 12s. Herein, let a pattern of "11011" be set as the third data series in the second sequence 12s, as shown in FIG. 5. It is noted here that the output data set on the partial output interface 24' is changed by production of the single clock pulse because of variation of the input conditions.

Step 9.

Subsequently, the mode control circuit 33 drives the respective registers 12 in the shift mode under control of the test controller 32.

Step 10.

Under the circumstances, the clock control circuit 35 supplies the respective registers 12 with the clock pulses CK when energized by the test controller 32. As a result, the third data series in the second sequence 12s of the partition 11' is shifted out through the fourth sequence 12o of the registers and the output line 22 to the second holding circuit 57.

Step 11.

The second holding circuit 57 holds only the third data series of "11011" for the specified partition 11' as the shift-out data series with reference to the second address of "11" and the second number of "5" held in the selecting circuit 52.

Step 12.

The first comparator 41 is supplied with the first correct pattern from the memory 31 through the test controller 32. Therefore, the first comparator 41 compares the shift-out data series of "11011" with the first correct pattern of "11010," with the shift-out data series remaining in the second holding circuit 57. Inasmuch as the shift-out data series is non-coincident with the first correct pattern in this example, the first comparator 41 produces the first fault signal for the specified partition 11'. The first fault signal is representative of a fault which takes place in any circuit section connected to the registers of the second sequence 12s in the specified partition 11'.

Step 13.

Responsive to the first fault signal, the test controller 32 energizes, together with the arranging circuit 59, the first and second holding circuits 55 and 57 in which the shift-in and shift-out data series are kept as the first and third data series, respectively. Consequently, the first data series and third data series are moved from the first and second holding circuits 55 and 57 to the arranging circuit 59, respectively. The arranging circuit 59 combines the first data series with the third data series to form the second data series described before. In addition, the test controller 32 derives the first number of "6" and the second number of "5" from the selecting circuit 52 to calculate a total length of the second data series and to supply the arranging circuit 59 with the total length.

Step 14.

Next, the second data series and the total length are moved as the shift-in data series from the arranging circuit 59 to the first holding circuit 55 to be substituted for the first data series.

Step 15.

The test controller 32 energizes the clock control circuit 35 and the shift control circuit 36 when the shift-in data series is kept in the first holding circuit 55. The shift control circuit 36 supplies the registers 12 with the shift-in data series of the first holding circuit 55 with reference to the first address, the first number, the second address, and the second number all of which are kept in the selecting circuit 52. The shift operation is, of course, synchronized with the clock pulses CK supplied from the clock control circuit 35. The shift-in data series may be continuously kept in the first holding circuit 55 or not. Eventually, the registers of the first and the second sequences 12f and 12s in the specified partition 11' hold the first data series or the first partial test pattern of "001011" and the third data series or the internal status data set of "11011," respectively, both of which are included in the second or shift-in data series.

Step 16.

Under these circumstances, the mode control circuit 33 puts the respective registers in the normal mode. The second test pattern is imparted again to the partial input interface 23' through the interface control circuit 38. This means that the specified partition 11' is restored to a logic state prior to the shift-out operation. Specifically, the external status data set, which was already found to be correct in Step 6, appears at the partial output interface 24' while the internal status data set actually appears at the input sides of the registers of the second sequence 12s. In addition, the first data series is kept in the registers of the first sequence 12f of the partition 11' and the third data series corresponding to the internal status data set is kept in the registers of the second sequence 12s.

Step 17.

A synchroscope or a probe (not shown) for making a diagnosis is brought into contact with the partition to observe the logic state and to locate the first fault with reference to the third data series held in the second sequence 12s. An actual status data set representative of the logic state may be compared with a correct data set to be generated in the partition 11' having no fault. In this manner, it is readily possible to locate the first fault.

While an embodiment of this invention has been described above, it would readily be understood by those skilled in the art to put this invention into practice in various manners. For example, it is possible to select the respective first partial test patterns without the selecting circuit when the selection of the first partial test patterns is possible in the test controller. Moreover, the arranging circuit 59 may be an operation register in the test controller. The first partial test pattern may not be read out of the memory 31 in fixed data length. In addition, it is needless to say that the test proceeds to the next following partition without Steps 13 through 17 when the first fault signal is not produced in the partition.

What is claimed is:

1. A method of testing a sequential circuit to detect a fault therein, said sequential circuit comprising a multiplicity of registers for storing information units, respectively, said registers being operable as normal registers in a normal mode and as a shift register with said registers connected in cascade in a shift mode, said sequential circuit being divisible into a succession of partitions each of which comprises a first and a second sequence of the registers of a first and a second predetermined number of registers, respectively, said method comprising the steps of:

preparing test patterns, predetermined for the respective partitions, and reference patterns for the respective test patterns, said test patterns each having a data length equal to the first predetermined number of registers in its respective partition, said reference patterns each having a data length equal to the second predetermined number of registers in its respective partition, each of said reference patterns checking said second sequence of said each partition;

allotting serial addresses to the respective registers connected in cascade;

deriving a first and a second address from said serial addresses, said first and said second addresses being the addresses allotted to the leading ones of the registers of the first and second sequences in each partition, one partition after another in said succession of partitions;

selecting one of said test patterns that is predetermined for said each partition;

imparting, in said shift mode, said one test pattern to the respective registers of the first sequence of said each partition as the information units for said registers with reference to said first address;

making, in said normal mode, the registers of the second sequence in said each partition hold a set of status data, resulting from said one test pattern, as the information units stored in the registers of the second sequence in said each partition, said status data set having a data length equal to the second predetermined number of registers in said each partition;

deriving said status data set in said shift mode from the registers of the second sequence in said each partition;

selecting one of said reference patterns prepared for said one test pattern; and comparing said status data set with the selected reference pattern to detect said fault when said status data is non-coincident with said reference pattern.

2. A device for testing a sequential circuit to detect a fault therein, said sequential circuit comprising a multiplicity of registers for storing information units, respectively, said registers being operable as normal registers in a normal mode and as a shift register with said registers connected in cascade in a shift mode, said sequential circuit having a succession of partitions each of which is formed by dividing said sequential circuit and has specifying numbers assigned thereto to specify each partition, each of said partitions comprising a first and a second sequence of the registers of a first and a second predetermined number of registers, respectively, said device comprising:

memory means for memorizing a program for the fault detection and a test pattern series separable into a series of partial test patterns corresponding to the respective partitions and each having a data length equal to the first predetermined number of registers in its respective partition, there being correct patterns predetermined for the respective partial test patterns and each having a data length of the second predetermined number of registers in its respective partitions;

reading means for reading said program to successively derive said specifying numbers to specify each of said partitions, one after another in each succession of partitions, and also for reading one of said partial test patterns as a first data series, said one partial test pattern corresponding to said each partition;

holding means responsive to said first data series and a second data series for holding said first and said second data series as a shift-in data series at first irrespective of presence and absence of a fault in said each partition and subsequently only when a fault is detected in said first partition, respectively;

driving means for driving said sequential circuit first in said shift mode, then in said normal mode, and again in said shift mode;

input-output means, operatively coupled to said reading means, said holding means and said driving means, for supplying, while said sequential circuit is first put in said shift mode, said shift-in data series to the registers of the first sequence in said each partition as the information units therefor with said shift-in data series kept in said holding means, and to the registers of both said first and second sequences of registers in said each partition as the information units therefor when said holding means holds said first and said second data series, respectively, and for deriving, while said sequential circuit is driven in said normal mode, a third data series of a data length equal to the second predetermined number of registers for said each partition from the first data series stored in the registers of the first sequence in said each partition to supply said third data series to the registers of the second sequence in said each partition and to make, while said sequential circuit is subsequently driven in said shift mode, the lastmentioned registers produce the imparted third data series as a shift-out data series;

comparing means for comparing said shift-out data series with the correct pattern predetermined for the partial test pattern corresponding to said each partition to produce a fault signal for said each partition when said shift-out data series is non-coincident with the last-mentioned correct pattern;

combining means operatively coupled to said comparing means and responsive to the first data series kept in said holding means and said shift-out data series for combining the last-mentioned first data series and said shift-out data series into a fourth data series when said comparing means produces said fault signal; and moving means for moving said fourth data series from said combining means to said holding means as said second data series.

3. A device as claimed in claim 2, the registers of the first sequence in said each partition being specified by a first address allotted to the leading one thereof and the first predetermined number of registers for said each partition, the registers of the second sequence in said each partition being specified by a second address allotted to the leading one thereof and the second predetermined number of registers for said each partition, said memory means being further for memorizing the first and the second addresses and the first and the second numbers for the respective partitions, wherein said reading means comprises:

first means for reading one of the first addresses and one of the first numbers as said specifying number out of said memory means to specify said each partition, for reading one of the second addresses and one of the second numbers for said specified partition and for partially reading said test pattern series out of said memory means; and second means for selecting the first data series for the specified partition from the read-out test pattern with reference to the read-out first address and first number and for selecting said shift-out data series from the registers of the second sequence in said specified partition with reference to the read-out second address and second number while said sequential circuit is driven in said shift mode following the drive in said normal mode;

said input-output means comprising:

means operatively coupled to said holding means, said driving means, and said first means for supplying the registers in said each partition with said shift-in data series; and means operatively coupled to said driving means and said second means for holding said shift-out data series in accordance with the read-out second address and second number while said sequential circuit is put in said shift mode following the drive in said normal mode.

4. A device as claimed in claims 2 or 3 for further locating a fault in said each partition, said driving means being put into operation in response to the fault signal produced for said each partition for further driving said sequential circuit again in said normal mode, said input-output means being for further making said each partition produce an actual status data series from the second data series stored in the registers of both said first and second sequences in said each partition while said sequential circuit is driven again in said normal mode, wherein said device further comprises fault locating means for comparing said actual status data series with a correct status data series to be produced when said each partition has no fault.

* * * * *

UNITED STATES PATENT AND TRADEMARK OFFICE
CERTIFICATE OF CORRECTION

PATENT NO. : 4,317,200

DATED : February 23, 1982

INVENTOR(S) : Wakatsuki et al

It is certified that error appears in the above—identified patent and that said Letters Patent is hereby corrected as shown below:

Column 5, line 12, before "mode" insert --shift--.

Column 6, line 24, change "and" to --the--.

Column 9, line 40, change "shaft" to --shift--.

Signed and Sealed this

Sixth Day of July 1982

|SEAL|

*Attest:*

*Attesting Officer*

GERALD J. MOSSINGHOFF

*Commissioner of Patents and Trademarks*